(12) United States Patent
Van Bommel et al.

(10) Patent No.: US 8,786,175 B2
(45) Date of Patent: Jul. 22, 2014

(54) LIGHTING DEVICE, A LAMP AND A LUMINAIRE

(75) Inventors: Ties Van Bommel, Horst (NL); Rifat Ata Mustafa Hikmet, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/004,511

(22) PCT Filed: Feb. 28, 2012

(86) PCT No.: PCT/IB2012/050917
§ 371 (c)(1),
(2), (4) Date: Sep. 11, 2013

(87) PCT Pub. No.: WO2012/123841
PCT Pub. Date: Sep. 20, 2012

(65) Prior Publication Data
US 2013/0342100 A1     Dec. 26, 2013

(30) Foreign Application Priority Data
Mar. 16, 2011   (EP) .................................... 11158459

(51) Int. Cl.
*H01J 1/26*    (2006.01)
*H01J 63/04*   (2006.01)
*H01J 61/40*   (2006.01)
*H01J 61/38*   (2006.01)
*H01L 33/50*   (2010.01)
*H01K 1/26*    (2006.01)

(52) U.S. Cl.
CPC ................. *H01J 61/40* (2013.01); *H01J 61/38* (2013.01); *H01L 33/507* (2013.01); *H01L 33/502* (2013.01); *H01K 1/26* (2013.01)
USPC ........... 313/501; 313/502; 313/498; 313/112; 362/166; 362/255; 362/256; 362/293; 362/510

(58) Field of Classification Search
CPC ............. F21K 9/135; F21K 9/56; F21V 3/00; F21V 7/0016; F21V 9/08; F21V 9/00; F21V 9/10; H01L 33/508; H01L 27/3244; H01L 27/3248; H01L 27/3258; H01L 27/1214; H01L 27/12; H01L 51/524; H01L 51/5246; H01L 51/5253; H01L 51/5259; H01L 51/5212; H01L 51/5052; H01L 51/5088; H01L 51/5092; H01L 51/5228; H01L 51/529; H01L 29/458; H01L 29/4908; H01L 29/04; H01L 29/66765; H01L 29/78696; H01L 29/66757; H01L 29/78621; H01L 33/50; H01L 33/502; H01L 33/504; H01L 33/507; H01L 27/322; H01L 27/3276; H05B 33/145; H05B 33/22; G02F 1/133516; G02F 1/1334; G02F 1/133555; G02F 1/136286; G02F 1/1368; G02F 1/13454; G02F 1/136227; G02F 2201/50; B41M 3/003; H01J 61/40; H01J 61/38; H01J 11/44; H01J 61/35; F21S 10/02; H01K 1/32
USPC ......... 313/489, 498, 501–502, 512, 110–113; 362/166, 255–256, 293, 510
See application file for complete search history.

(56) References Cited

U.S. PATENT DOCUMENTS

| | | | |
|---|---|---|---|
| 5,749,646 A * | 5/1998 | Brittell | ........................ 362/231 |
| 7,319,246 B2 | 1/2008 | Soules et al. | |
| 7,462,878 B2 | 12/2008 | Richter et al. | |
| 2007/0267976 A1 | 11/2007 | Bohler et al. | |
| 2009/0002979 A1* | 1/2009 | Medendorp et al. | .......... 362/231 |
| 2009/0141474 A1* | 6/2009 | Kolodin | ......................... 362/84 |
| 2010/0103682 A1 | 4/2010 | Lin | |
| 2012/0014086 A1* | 1/2012 | Jonsson | ........................ 362/84 |
| 2012/0056527 A1* | 3/2012 | Mitsuishi et al. | ............. 313/503 |
| 2012/0057327 A1* | 3/2012 | Le et al. | ......................... 362/84 |
| 2012/0161626 A1* | 6/2012 | van de Ven et al. | ............. 315/35 |

| | | | | |
|---|---|---|---|---|
| 2013/0093362 A1* | 4/2013 | Edwards | | 315/313 |
| 2013/0148346 A1* | 6/2013 | Sun et al. | | 362/235 |
| 2014/0043823 A1* | 2/2014 | Liu et al. | | 362/294 |

FOREIGN PATENT DOCUMENTS

| | | | |
|---|---|---|---|
| GB | 2466787 A | 7/2010 | |
| WO | 2009150574 A1 | 12/2009 | |
| WO | 2010106504 A1 | 9/2010 | |

\* cited by examiner

*Primary Examiner* — Nimeshkumar Patel
*Assistant Examiner* — Jose M Diaz
(74) *Attorney, Agent, or Firm* — Yuliya Mathis

(57) ABSTRACT

A lighting device 100, a lamp and a luminaire is provided. The light device 100 emits a first color distribution predominantly in a first direction and a second color distribution predominantly in a second direction. The lighting device comprises a light exit window, a light source 118, a light distributing layer 108, and a luminescent material. Light 104, 106 is emitted into the ambient of the lighting device through the light exit window. The light exit window has a first part 110 for an escape of light of the first color distribution and a second part 102 for an escape of light of the second color distribution. The second part 102 is different from the first part 110. The light source emits light of a predefined color distribution. The predefined color distribution comprises light of a first color 106. The light distributing layer 108 partly reflects or backscatters impinging light and partly transmits impinging light. The light distributing layer 108 is arranged in between the light source 118 and the second part 102 of the light exit window. The light distributing layer 108 is not fully transparent and has an edge near the light exit window for separating the first part 110 and the second part 102. The luminescent material converts light of the first color 106 to light of a second color 104. The luminescent material is arranged in the light distributing layer 108, is arranged in between the light distributing layer 108 and the second part 102 of the light exit window, or is arranged at the first part 110 of the light exit window or the second part 102 of the light exit window.

15 Claims, 5 Drawing Sheets

LIGHTING DEVICE, A LAMP AND A LUMINAIRE

FIELD OF THE INVENTION

The invention relates to lighting devices which emit different color distributions through different parts of a light exit window of the lighting device. Such lighting devices are, for example, used in luminaires which are located near a ceiling of an office. Light of a first color is emitted to the ceiling to create a specific atmosphere and light of a second color is, for example, emitted towards the desks in the office to obtain a desired lighting situation at the desks. Such lighting devices are also used in headlights of cars. More yellow light is shone into the direction in front of the car to prevent dazzling of other road users, and more blue light is shone towards the side of the road to provide to the driver a better sight of the side of the road.

BACKGROUND OF THE INVENTION

Published patent application WO2009/150574A1 discloses a lamp unit which emits different wavelength spectra in different directions. The lamp unit comprises two light sources which each emit light of a different wavelength spectrum. The lamp unit comprises different optical means to direct the light of the different wavelength spectra in different directions. An embodiment relates to a retrofit light bulb which comprises in the middle of the light bulb a nontransparent separator on which a first light emitter is applied which emits light to the ambient through a first part of the light bulb. In the base of the light bulb is manufactured a second light emitter which emits light to a second part of the light bulb and to the nontransparent, but reflecting, separator. The first light emitter emits another color of light than the second light emitter. Consequently, through different parts of the light bulb light of different color wavelength spectra are emitted into the ambient of the light bulb. Another embodiment of the cited patent application relates to the placement of different light emitters on different sides a nontransparent support structure which is placed in a retrofit lamp such that the light emitters emit light of different colors into opposite directions. Other embodiments relate to using reflectors or light guiding structures which influence the light emission direction of light of different colors which are emitted by different light emitters.

The embodiments of the cited patent application are relatively complex, because they require, for example, a complex wiring pattern within the light bulb, and require special structures to which the light emitters are coupled. Further, the lamp units comprise at least two light emitters which each emit a different color. Thus, the lamp units of the cited patent application are relatively complex and as a consequence relatively expensive.

SUMMARY OF THE INVENTION

It is an object of the invention to provide a lighting device which emits different colors of light in different directions which is more cost effectively.

A first aspect of the invention provides lighting device as claimed in claim 1. A second aspect of the invention provides a lamp as claimed in claim 12. A third aspect of the invention provides a luminaire as claimed in claim 14. Advantageous embodiments are defined in the dependent claims.

A lighting device in accordance with the first aspect of the invention emits a first color distribution predominantly in a first direction and a second color distribution predominantly in a second direction. The lighting device comprises a light exit window, a light source, a light distributing layer, and a luminescent material. Light is emitted into the ambient of the lighting device through the light exit window. The light exit window has a first part for an escape of light of the first color distribution and a second part for an escape of light of the second color distribution. The second part is different from the first part. The light source emits light of a predefined color distribution. The predefined color distribution comprises light of a first color. The light distributing layer partly reflects or backscatters impinging light and partly transmits impinging light. The light distributing layer is arranged in between the light source and the second part of the light exit window. The light distributing layer is not fully transparent and has an edge near the light exit window for separating the first part and the second part. The luminescent material converts light of the first color to light of a second color. The luminescent material is arranged in the light distributing layer, or is arranged in between the light distributing layer and the second part of the light exit window, or is arranged on the first part of the light exit window or on the second part of the light exit window.

The light distributing layer forms a separation between the first part of the light exit window and the second part of the light exit window. The edge of the light distributing layer is near to a boundary between the first part and the second part of the light exit window. Especially, because of a not fully transparent light distributing layer, the characteristics of the light at one side of the light distributing layer is different from the characteristics of the light at the other side of the light distributing layer. The light distributing layer reflects a portion of or backscatters a portion of impinging light and transmits a portion of the impinging light which originates from the light source and as such this part of the light is not transmitted through the light distributing layer and not emitted through the second part of the light exit window. Further, the light distributing layer may change other characteristics of the light, such as the light ray directions, especially when the light distributing layer also scatters the light in the forward direction, which is the direction in which the light is transmitted through the light distributing layer.

The luminescent material creates a different color distribution than the color distribution of the light source and in combination with the light distributing layer the luminescent material creates the difference in color of the light at the two sides of the light distributing layer. The luminescent material absorbs a part of the light of the first color and partly converts the energy of the absorbed light towards light of the second color.

The luminescent material may be arranged in between the light distributing layer and the second part of the light exit window. Thus, light of the second color is generated at a side of the light distributing layer which is facing towards the second part of the light exit window and light of the second color is emitted to a large extent through the second part of the light exit window. Because the light distributing layer is not fully transparent and may partly reflect light, light of the second color is only transmitted through the light distributing layer to a limited extent. Consequently, only a small portion of the light which exits the lighting device via the first part of the light exit window is light of the second color. In this case, the main function of the light distributing layer is limiting the amount of light of the second color to be transmitted through the light distributing layer. Further, the light, which is transmitted through the light distributing layer and which originates from the light source, is of a predefined color distribution. The first color is partly absorbed and as such the predefined color distribution changes towards a color distribution with a lower amount of the first color. Thus, the light, which exits through the second part of the light exit window, comprises a limited amount of light of the first color (as generated by the light source). At the same time, the light which is emitted through the first part of the light exit window originates for a large extent directly from the light source and may comprises the relatively small amount of light of the second color which is transmitted through the light distributing layer. Thus, the color distribution of the light that is emitted through the first part of the light exit window differs from the color distribution of the light that is emitted through the second part of the light exit window.

The luminescent material may also be arranged in the light distributing layer. Light of the second color is generated within the light distributing layer and as such emitted at both sides of the light distributing layer. Light of the predefined color distribution, which is emitted by the light source, partly reflects at the light distributing layer and is emitted via the first part of the light exit window into the ambient. Light of the predefined color distribution partly enters the light distributing layer. Inside the light distributing layer an amount of the light of the first color, which is available in the light of the predefined color distribution, is absorbed by the luminescent material and only a limited amount of light of the first color is transmitted through the light distributing layer. As a consequence, the light, which is emitted through the first part, consists for a significant portion of the light of the predefined distribution and for another portion of light of the second color. The light, which is emitted through the second part of the light exit window, consists of light of the second color and some light which originates from the light source, however, the portion of light of the first color is reduced because of the absorption of light of the first color by the luminescent material. Thus, the color distributions emitted through the first part and the second part of the light exit window differ.

The luminescent material may also be arranged on one of the parts of the light exit window. In that situation the light which is emitted through the part with the luminescent material comprises a substantial amount of light of the second color, while the light distributing layer only transmits a limited amount of light of the second color through the light distributing layer. Consequently, the light distribution emitted through the first part of the light exit window is different from the light distribution emitted through the second part of the light exit window.

The lighting device according to the invention has a relatively simple structure. The light sources may be positioned at a position which is most optimal with respect to providing power and providing a heat sink. Further, the light distributing layer is a relative simple component to separate the first part of the light window and the second part of the light window to enforce different light emission characteristics through the different parts of the light exit window. Further, providing a luminescent material in the light distributing layer or in between the light distributing layer and the second part of the light exit window is not complex, because luminescent material may be used very flexibly within materials or as coatings on other materials. Thus, a cost effective lighting device may be manufactured.

It is to be noted that, in the context of the invention, the light which is transmitted through the second part of the light exit window directly or indirectly originates from the light which is transmitted through the light distributing layer. Especially the light of the second color indirectly originates from the light which is transmitted through the light distributing layer, because light of the second color is the result of a conversion of a portion of the light of the predefined color distribution which is transmitted through the light distributing layer. The light which is not converted to the second color originates directly from the light which is transmitted through the light distributing layer. Further, a portion of the light, which is emitted through the first part of the light exit window and which is not transmitted through the light distributing layer, may comprise light rays which directly originate from the light source, and may comprise light rays which are reflected or scattered by the light distributing layer.

The light source may be any kind of light source, but, in a practical embodiment, the light source is a solid state light emitter, such as a light emitting diode, an organic light emitting diode or a laser diode. Further, the invention is not limited to lighting device which comprise only one light source. The lighting device may comprise a plurality of light source, and at least one of the plurality of light sources emits light which comprises the first color. In a practical embodiment all the light sources are arranged at one side of the light distributing layer.

The light distributing layer has an edge, which is the boundary of the layer. The edge is close to the light exit window and, in an embodiment, the edge is in contact with the light exit window thereby defining a discrete transition from the first part of the light exit window to the second part of the light exit window. In other embodiments, there is a small distance between the light distributing layer and the light exit window. The distance should be small enough to have at least the first part of the light exit window that predominantly emits the first color distribution and that the second part of the light exit window that predominantly emits the second color distribution. If the edge does not touch the light exit window, there is a transition area in between the first part and the second part of the light exit window.

In this context, light of a predefined color distribution, of the first color, and/or of the second color typically comprise light having a predefined spectrum. The predefined spectrum, the first color, and/or the second color may, for example, comprise a primary color having a specific bandwidth around a predefined wavelength, or may, for example, comprise a plurality of primary colors. The predefined wavelength is a mean wavelength of a radiant power spectral distribution. In this context, light of a predefined color distribution may also include non-visible light, such as ultraviolet light. The light of a primary color, for example, includes Red, Green, Blue, Yellow and Amber light. Light of the predefined color distribution, of the first color and/or of the second color may also comprise mixtures of primary colors, such as Blue and Amber, or Blue, Yellow and Red. By choosing, for example, a specific combination of the Red, Green and Blue light substantially every color can be generated by the light emitting module, including white.

The light distributing layer is at least light transmitting, which means that at least a portion of the light, which impinges on the luminescent product, is transmitted through the luminescent product and is once again emitted into the environment of the luminescent product. The light distributing layer is not fully transparent, meaning that it is not completely clear. Thus, reflection and scattering takes place within the light distributing layer or at the surfaces of the light distributing layer, further some light may also be absorbed by the light distributing layer. The light distributing layer is not be fully transparent because, if the light distributing layer would be fully transparent, its function of separating the first part of the light exit window and the second part of the light exit window does not work. Thus, the luminescent product may be partially transparent, or may be translucent.

In an embodiment, the light distributing layer comprises a diffusing plate. A diffusing plate better functions as a separation layer between the first part and the second part of the light exit window to obtain a first color distribution which deviates more from the second color distribution. The diffusing plate may comprise diffusing particles or scattering particles.

In another embodiment, at least one of: the predefined color distribution, the first color and the second color, comprises light of a wavelength in the visible light spectrum. In a practical embodiment, at least one of: the predefined color distribution, the first color and the second color, does not comprise light outside the visible light spectrum. 'Not comprising light outside the visible spectrum' is a relative term, still a small percentage, for example, a percentage lower than 5%, of the light in at least one of the predefined color distribution, the first color and the second color, is light outside the spectrum of visible light.

In an embodiment, the luminescent material is an organic phosphor. Organic phosphors have a high quantum efficiency and are often transparent, which may prevents undesired scattering and increases efficiency. Organic luminescent materials have more advantages. The position and the bandwidth of the luminescence spectrum can be designed with ease to be anywhere in the visible range. As such it is relatively easy to manufacture a lighting device which emits white light with high efficacy. The white light may be a combination of at least two colors of light, and thus the lighting device may comprise a single light source emits light of a first color and comprise at least one organic luminescent material converts a part of the light of the first color into a light of a second color.

In a further embodiment, the organic phosphor comprises perylene derivatives.

In an embodiment, the lighting device further comprises another luminescent material being arranged in between the light source and the first part of the light exit window or arranged in between the light source and the light distributing layer. The another luminescent material further influences the light output of the lighting device and because of its positioning the first part of the light exit window comprises more light of the third color compared to the second part of the light exit window. The light distributing layer forms a barrier for the light of the third color and as such less light of the third color is transmitted towards the second part of the light exit window. It is to be noted that the light distributing layer may be coated at one side, which is the side facing towards the light source, with the another luminescent material, and that another side, which is the side facing away from the light source, may be coated with the luminescent material. The light distributing layer may also comprise two layers, a first layer with the luminescent material, and a second layer with the another luminescent material. Further, in line with previous embodiments, the another luminescent material may be an organic phosphor, and may comprises perylene derivatives.

In another embodiment, the lighting device further comprises a further light distributing layer arranged in between the light distributing layer and the second part of the light exit window. The further light distributing layer is not fully transparent. The light exit window has a third part overlapping with a sector of the second part of the light exit window. The further light distributing layer has an edge near the light exit window for forming a border of the third part.

Light which is, in use, transmitted through the third part of the light exit window is transmitted through the light distributing layer and the further light distributing layer. At least a portion of the light which is, in use, transmitted through the second part is transmitted through the light distributing layer and not through the further light distributing layer. At least a portion of the light which is, in use, transmitted through the first part of the light exit window is not transmitted through the light distributing layer and not transmitted through the further light distributing layer.

Thus, light rays which are emitted through the third part of the light exit window follow a path from the light source, through the light distributing layer, through the further light distributing layer and finally through the third part of the light exit window. The lighting device according to the embodiment provides the light exit window which comprises of three parts, wherein the first part emits light of first light distribution, a portion of the second part which does not overlap with the third part emits light of the second light distribution, and the third part emits light of a third light distribution, and thus more flexibility is obtained in designing a lighting device and more advanced lighting patterns may be generated by lighting systems which use the lighting device according to the embodiment.

In an embodiment, the lighting device comprises a further luminescent material for converting light of the first color to light of a fourth color. The luminescent material is arranged in the further light distributing layer, or in between the further light distributing layer and the third part of the light exit window. The further luminescent material influences the light emission through the second part and the third part of the light exit window. In particular, more light of the fourth color may be transmitted through the third part compared to the portion of the second part that does not overlap with the third part of the light exit window. Especially, the combination of the further light distributing layer and the further luminescent material provide additional flexibility to influence the light output of the lighting device in specific directions. Further, in line with previous embodiments, the further luminescent material may be an organic phosphor, and may comprise perylene derivatives.

In practical embodiments, if the lighting device comprises the further luminescent material, the luminescent material is not arranged in the further light distributing layer and not in between the further light distributing layer and the third part of the light exit window. Thus, the luminescent material may be arranged in the light distributing layer, in between the light distributing layer and the part of the second part that does not overlap with the third part of the light exit window, or in between the light distributing layer and the further light distributing layer. Thus, in an example, the further light distributing layer may have at a side, which faces towards the light distributing layer, a coating of the luminescent material, an another side, which faces towards the third part of the light exit window, a coating of the further luminescent material.

In an embodiment, the light source is provided on the light distributing layer and the light source emits light in a direction away from the light distributing layer, or the light source is provided on the further light distributing layer and the light source emits light in a direction away from the further light distributing layer. Only light which is reflected back by the light exit window may be transmitted through the light distributing layer. Thus, a substantial amount of light emitted by the light source is directly emitted through the light exit window and only a relatively small part is transmitted via the light distributing layer to another part of the lighting device for exiting luminescent material and for being emitted through another part of the light exit window. Thus, a clear distinction is present between the first color distribution emitted via the first part of the light exit window and the second color distribution emitted via the second part of the light exit window. If the lighting device has a plurality of light sources they are all provided on the same side of the light distributing layer or the further light distributing layer.

In another embodiment, the light distributing layer and/or the further light distributing layer have a shape which is non-flat for influencing the directions in which light is reflected, transmitted, scattered and/or emitted. The shape of the light distributing layer and the further light distributing layer is a further parameter of the lighting device which influences the light output distributions through the first part of the light exit window and the second part of the light exit window. The shape may, for example, be a shape of repeating waves, to reflect and/or scatter the light, which impinges on the light distributing layer or the further light transmitting, such that a wider angular light emission distribution is obtained or the light emission directions are more uniformly spread.

In an embodiment, the lighting device further comprises at least one of: i) a switchable scattering element arranged for scattering light in response to a control signal, ii) a dichromatic filter for filtering a color of light which is transmitted through the dichromatic filter and reflecting light of another color. The switchable scattering element and/or the dichromatic filter may be arranged in any desired arrangements, for example, on one of the sides of the light distributing layer, or in between the light source and the light distributing layer, or in between the light distributing layer and a part of the second part of the light exit window. If the switchable scattering element and/or the dichromatic filter is arranged in between the light source and the light distributing layer, they may touch with an edge the first part of the light exit window thereby further subdividing the first part of the light exit window such that two different color distributions are emitted through different portions of the first part of the light exit window. If the switchable scattering element and/or the dichromatic filter is arranged in between the light distributing layer and the part of the second part of the light exit window, they may touch with an edge the second part of the light exit window thereby further subdividing the second part of the light exit window such that two different color distributions are emitted through different portions of the second part of the light exit window. The amount of scattering of the switchable scattering element may be controlled by the control signal. At a specific control signal the switchable scattering element does not scatter at a specific another control signal the switchable scattering element scatters all the light which impinges on the switchable scattering element.

According to a second aspect of the invention, a lamp is provided which comprises the lighting device according to the first aspect of the invention.

The lamp according to the second aspect of the invention provides the same benefits as the lighting device according to the first aspect of the invention and has similar embodiments with similar effects as the corresponding embodiments of the lighting device.

In an embodiment, the lamp comprises a retrofit light bulb or a light transmitting tube. The light exit window is formed by the retrofit light bulb and the light source is arranged on a base of the retrofit light bulb. Or, the light exit window is formed by a part of the light transmitting tube and the light source is arranged on a section of the light transmitting tube being different from the light exit window. The embodiment provides opportunities to create lamps which fit is luminaires designed for traditional light bulbs of light tubes, and to emit with these luminaires light of different color distributions is emitted in different directions.

According to a third aspect, a luminaire is provided which comprises a lighting device according to the first aspect of the invention or comprises a lamp according to the second aspect of the invention.

The luminaire according to the third aspect of the invention provides the same benefits as the lighting device according to the first aspect of the invention or the lamp according to the second aspect of the invention and has similar embodiments with similar effects as the corresponding embodiments of the lighting device or of the lamp.

These and other aspects of the invention are apparent from and will be elucidated with reference to the embodiments described hereinafter.

It will be appreciated by those skilled in the art that two or more of the above-mentioned embodiments, implementations, and/or aspects of the invention may be combined in any way deemed useful.

Modifications and variations of the lighting device, the lamp, or the luminaire, which correspond to the described modifications and variations of the lighting device, can be carried out by a person skilled in the art on the basis of the present description.

Figure 1:
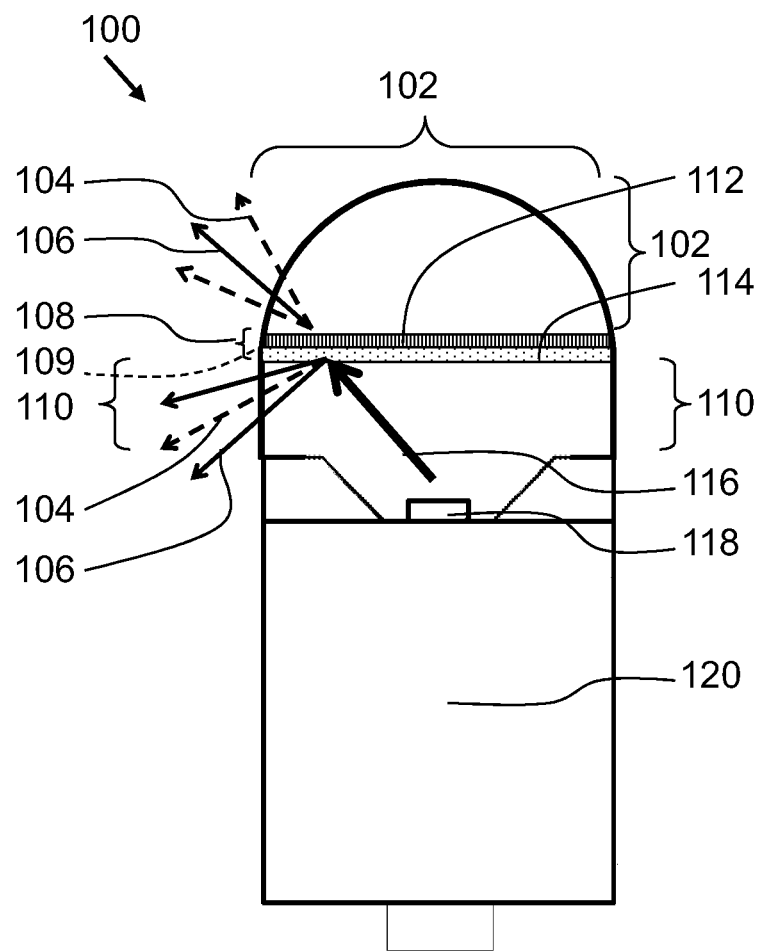
FIG. 1 schematically shows an embodiment of a lighting device according to the first aspect of the invention, FIG. 2a schematically shows embodiments of a lamp according to the second aspect of the invention, FIG. 2b schematically shows other embodiments of lamps with non-flat light distributing layers, FIG. 3a schematically shows an embodiment of a lamp which comprises two light distributing layers each comprising another luminescent material, FIG. 3b schematically shows an embodiment of a lamp wherein the light sources are provided on the light distributing layer, FIGS. 4a and 4b schematically show embodiments of lamps wherein a first luminescent coating and a second luminescent coating are applied to, respectively, a first part and a second part of the light exit window, FIG. 5a schematically presents an embodiment of a light tube according to the second aspect of the invention, and FIG. 5b schematically presents a luminaire according to the third aspect of the invention.

It should be noted that items denoted by the same reference numerals in different Figures have the same structural features and the same functions, or are the same signals. Where the function and/or structure of such an item have been explained, there is no necessity for repeated explanation thereof in the detailed description.

The figures are purely diagrammatic and not drawn to scale. Particularly for clarity, some dimensions are exaggerated strongly.

DETAILED DESCRIPTION

A first embodiment is shown in FIG. 1. A cross-section of a lighting device 100 is presented. The lighting device 100 has a base 120 on which a light source 118 is provided. The light source 118 emits light of a predefined color distribution 106. Although only one light ray 116 of light of the predefined color is drawn, a top surface of the light source 118 emits light in substantially all directions. The light of the predefined color distribution 106 comprises at least light of the first color. The lighting device 100 further comprises a light exit window which is subdivided in a first part 110 and a second part 102. The lighting device also comprises a light distributing layer 108 which is not fully transparent and comprises two layers, namely a carrier layer 114 which transmits light and luminescent layer 112 which comprises luminescent material. If light which comprises the first color impinges on the luminescent material, some of the light is absorbed, especially in a relatively narrow spectrum of the first color, and the absorbed light is converted to light of a second color 104. The light distributing layer 108 has an edge 109 which touches the light exit window and thereby it forms the transition from the first part 102 of the light exit window to the second part 110 of the light exit window.

As seen in FIG. 1, the light ray 116, which is emitted by the light source 118, impinges on the carrier layer 114 and is partly reflected towards the first part 110 of the light exit window and, consequently, a relatively large amount of light of the predefined color 106 is emitted through the first part 110 of the light exit window. Some light of the predefined color 106 enters the carrier layer 114 and is transmitted to the luminescent layer and finally transmitted towards the second part 102 of the light exit window. Thus, a relatively low amount of light of the predefined color 106 is emitted through the second part 102 of the light exit window. In the luminescent layer, some light of the first color is absorbed by the luminescent material and light of the second color 104 is emitted by the luminescent material. The luminescent material emits light in substantially all directions and thus light of the second color 104 is emitted towards the second part 102 of the light exit window and light of the second color 104 is emitted towards the carrier layer 114. At the interface between the luminescent layer 112 and the carrier layer 114 some light of the second color 104 is reflected back to the luminescent layer 112. A relatively small amount of light of the second color 104 is transmitted through the carrier layer 114 and as such emitted into the ambient of the lighting device 100 through the first part 110 of the light exit window. Consequently, the light which is emitted via the first part 110 of the light exit window comprises to a large extent light of the predefined distribution 106 which directly originates (possibly after a single reflection at the light distributing layer 108) from the light source 118 and comprises a small amount light of the second color 104. The light which is emitted through the second part 102 of the light exit window comprises some light of the predefined distribution 106 minus the light of the first color that is absorbed by the luminescent material and comprises to a large extent light of the second color 104. Thus, different color distributions are emitted through the different parts of the light exit window. The first part 110 of the light exit window and the second part 102 of the light exit window are separated in space and as such are the different color distributions emitted into different directions.

Figure 2A:
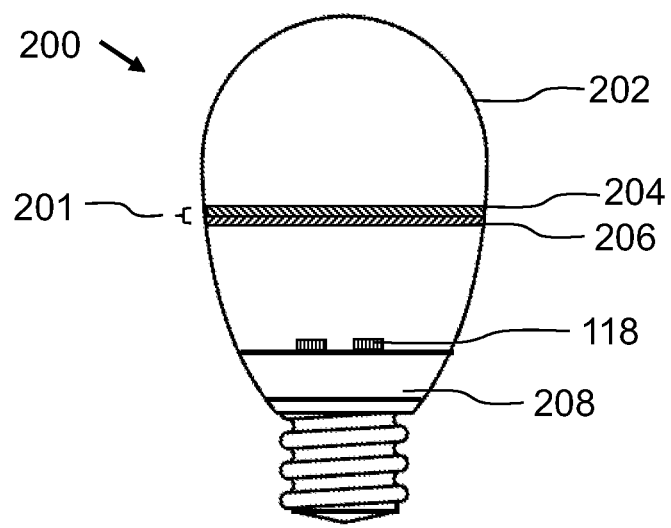

FIG. 2a shows an embodiment of a lamp 200 which comprises a retrofit light bulb 202. The lamp 200 has a base 208 on which two light sources 118 are provided. At least one of the light sources 118 emits, in use, light of a predefined color distribution which comprises light of the first color distribution. The other one of the light sources may emit the same predefined color distribution, or another color distribution. The retrofit light bulb 202 is a light exit window of the lamp and is subdivided in a first part, which is adjacent to the base, and a second part which is a part of the light exit window that is separated from the first part by a light distributing layer 201. The light distributing layer 201 comprises two luminescent layers 204, 206 that comprise luminescent material. The first luminescent layer 206 comprises a first luminescent material that converts light of the first color to light of the second color. The second luminescent layer 204 comprises a second luminescent material that converts light of the first color to light of the third color. A portion of light which is emitted by the light sources 118 is directly emitted towards the first part of the light exit window. Another portion of the light emitted by the light sources 118 is reflected by the light distributing layer 201 towards the first part of the light exit window. Another portion of the light source by the light sources 118 is emitted into the light distributing layer 201. Some light of a portion of light that is emitted by the light distributing layer 201 towards the second part of the light exit window. Further some light of the portion is converted to the second color and the third color in, respectively, the first luminescent layer 206 and the second luminescent layer 204. Because of the position of the first luminescent layer 206 within the light distributing layer 201, most light of the second color is emitted towards the first part of the light exit window. For the same reason, most light of the third color is emitted towards the second part of the light exit window. Consequently, a color distribution which is emitted through the first part of the light exit window mainly comprises light which directly originates from the light source 118 and partly comprises light of the second color. A color distribution which is emitted through the second part of the light exit window comprises some light which directly originates from the light source 118 and comprises a relative large amount of light of the third color. Thus, different light distributions are emitted through the different parts of the light exit window of lamp 200. As seen in FIG. 2a, the construction of the lamp 200 is relatively simple. Retrofit light bulbs 202 have always a place where they are attached to the base 208 and the base 208 is traditionally the place where power is received. Thus, the positioning of the light sources 118 on the base 208 is the most cost effective placement of the light sources 118. Further, within the light bulb 202 only two layers of a luminescent material have to be provided at some distance away from the light sources 118. This may be manufactured relatively efficiently and, thus, with only a limited increase of the manufacturing costs of the lamp 200, a lamp 200 is obtained which emits two different color distributions in two different directions.

In FIG. 2a the first luminescent layer 206 and the second luminescent layer 204 have the same size. In an alternative embodiment, the first luminescent layer 206 touches with its edge the light exit window for separating the first part of the light exit window from the second part of the light exit window, and the second luminescent layer 204 is of a smaller size and only partly covers the first luminescent layer 206. In another alternative embodiment, the second luminescent layer 204 touches with its edge the light exit window for separating the first part of the light exit window from the second part of the light exit window, and the first luminescent layer 206 is of a smaller size and only partly covers the second luminescent layer 204.

In FIG. 2a the light distributing layer 201 comprises two luminescent layers, however, in an alternative embodiment, the light distributing layer 201 comprise three or more luminescent layers. Or, in another alternative embodiment, a mix of a plurality of different luminescent materials is provided within the light distributing layer 201.

Figure 2B:
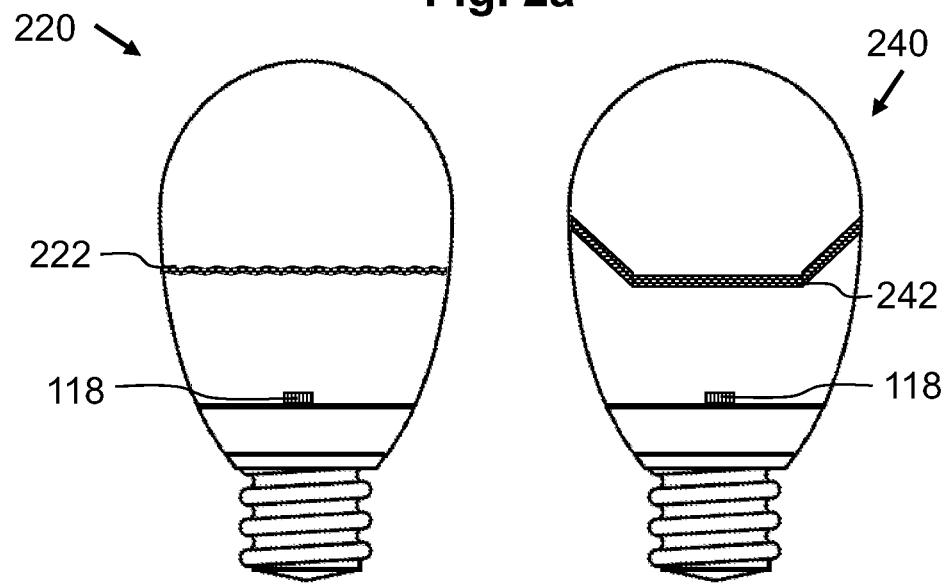

In FIG. 2b two different embodiments of lamps 220, 240 are presented. The lamps 220, 240 are similar to the lamp 200 of FIG. 2a, however, there are three important differences. The lamps 220, 240 only comprise a single light source 118 provided on the base of the lamps 220, 240. The light sources 118 emit light of the predefined color distribution which comprises light of the first color. Further, the light distributing layers 222, 242 comprise a single luminescent material for converting light of the first color into light of the second color. Finally, the shape of the light distributing layers 222, 242 is not flat.

Lamp 220 has a light distributing layer 222 which has a waved shape, meaning that a cross-section of the light distributing layer 222 follows, for example, a sinusoidal wave. Such a light distributing layer 222 provides reflection and scattering in a plurality of directions such that the angular distribution of the light which is reflected by and emitted by the light distributing layer 222 is wider, meaning that the light is emitted in more directions. This results in a better light mixing and obtaining a more uniform light output distribution. Thus, the lamp 220 has at the first part of the light exit window and at the second part of the light exit window a substantially uniform light output and has a wide angular emission distribution.

Lamp 240 comprises a light distributing layer 242 which has comprises several flat parts. Depending on the specific shape, the light output distributions of the first part and of the second part may be influenced. For example, if light of the light source 118 impinges on the light distributing layer 242 at an angle larger than the critical angle, it is fully reflected instead of partly reflected and partly transmitted through the light distributing layer 242. Thus, in the example of lamp 240, light directly originating from the light source 118 and impinging on the left or right portion of the light distributing layer 242 is not transmitted through the light distributing layer 242 and as such the light output distributions through the first part of the light exit window and the second part are influenced.

Figure 3A:
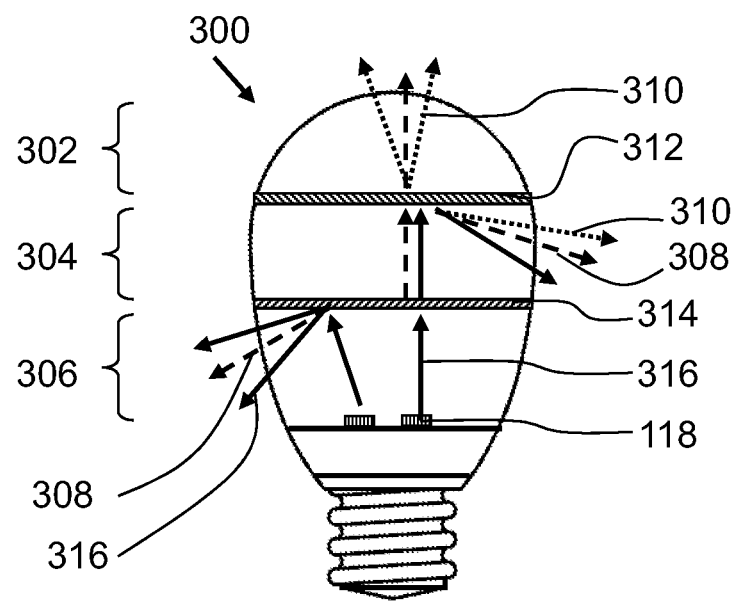

FIG. 3a shows another embodiment of a lamp 300 according to the invention. The lamp 300 comprises two light sources 118 provided on the base of the lamp 300. The light sources 118 emit light of the first color 316. The light exit window is subdivided in three parts: a first part 306 immediately adjacent to the base, a second part 304 which is a middle section of the light exit window, and a third part 302 which is the top section of the light exit window. Two light distributing layers 312, 314 are provided within the lamp to form the barriers between the different parts of the light exit window.

The first light distributing layer 314 has an edge which touches the light exit window thereby forming the border between the first part 306 and the second part 304 of the light exit window. The first light distributing layer 314 comprises a first organic phosphor for converting light of the first color 316 into light of the second color 308. The first light distributing layer 314 partly reflects the light which directly originates from the light sources 118, partly transmits the light which directly originates from the light sources towards the second light distributing layer 312, and partly converts the light towards light of the second color 308. The light of the second color 308 is emitted in substantially all directions. Consequently, the color distribution of light that is emitted through the first part 306 of the light exit window mainly comprises light of the first color 316 and some light of the second color 308.

The second light distributing layer 312 has an edge which touches the light exit window thereby forming the border between the second part 304 and the third part 302 of the light exit window. The second light distributing layer 312 comprises a second organic phosphor for converting light of the first color 316 into light of the third color 310. The light of the first color 316 of which a portion still impinges on the second light distributing layer 312 is reflected towards the second part 304 of the light exit window or absorbed by the second organic phosphor. The light of the first color 316, which is absorbed by the second organic phosphor, is converted into light of the third color 310. The light of the third color is emitted in a plurality of directions and as such towards the second part of the light exit window and towards the third part of the light exit window. As shown in FIG. 3a, the color distribution of light that is emitted through the second part 304 of the light exit window comprises light of the first color 316, light of the second color 308 and light of the third color 310. The color distribution of light that is emitted through the third part 302 of the light exit window comprises light of the third color 310 and light of the second color 308. Thus, different color distributions are emitted through all parts of the light exit window in different direction.

In another embodiment, still a small amount of light of the first color 316 may be transmitted through the second light distributing layer 312 towards the third part 302 of the light exit window and thus may the color distribution of light emitted through the third part 302 of the light exit window also comprise a relatively small amount of light of the third color.

The first and the second organic phosphors comprise perylene derivatives, such as, for example, yellow emitting phosphors (lumogen f083 or f170 from BASF) or, for example, red emitting phosphors (lumogen f305). Further, the first light distributing layer 314 may comprise a first mix of organic phosphors and the second light distributing layer 312 may comprises a second mix of organic phosphors which is different from the first mix. By using specific mixes of phosphors, the color distributions of the light which is emitted through the different parts 302, 304, 306 may be tuned to specific predefined color distributions.

The light source 118 emits light of the first color 316. This may be a color in the visible spectrum, such as, for example, blue. In other embodiment, the light of the first color may be light in the UV spectrum. In such cases the light bulb of the lamp 300 has to absorb the UV light and only colors of light in the visible spectrum are emitted through the different parts 302, 304, 306 of the light exit window.

Figure 3B:
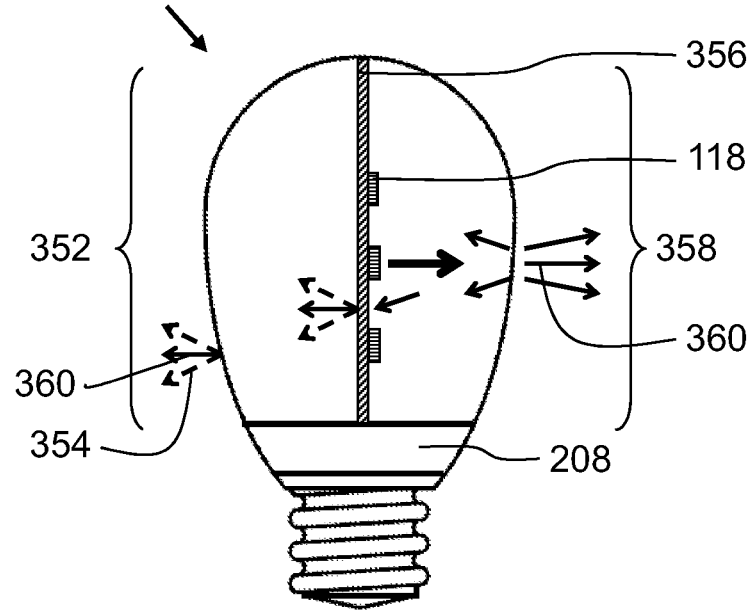

In FIG. 3b, a cross-section of another embodiment of a lamp 350 is presented. The light sources 118 are not provided on the base, but are provided on a light distributing layer 356. The light distributing layer 356 has an edge, and a part of the edge touches the base 308, and another part of the edge touches the light exit window thereby separating a first part 358 from a second part 352 of the light exit window. The light sources 118 emit light of a first color 360 towards the first part 358 of the light exit window. At the light bulb, which is actually the light exit window, a substantially amount of light of the first color 360 is emitted into the ambient of the light exit window, and some light is reflected back towards the light sources 118 and thus to the light distributing layer 356. The light distributing layer 356 is not fully transparent and comprises a luminescent material for converting light of a first color towards light of a second color. A relatively large amount of light which impinges on the light distributing layer 356 enters the light distributing layer 356. Some light is transmitted through the light distributing layer and some light is absorbed by the luminescent material and converted to light of the second color 354. Thus, the light which is emitted through the second part 352 of the light exit window into the ambient consists for a relatively small portion of light of the first color 360 and for a larger portion of light of the second color 354.

In an alternative embodiment of the lamp 350, the light sources are provided on the light bulb, and thus on the first part 358 of the light exit window, and emit light to the light distributing layer 356. The light distributing layer 356 reflects a part of the emitted light and transmits a part of the emitted light and the luminescent material within the light distributing layer converts light of the first color towards light of the second color. In line with previous discussed embodiments, more light of the first color is emitted through the first part 358 of the light exit window compared to the amount of light of the first color that is emitted through the second part 352 of the light exit window.

Figure 4A:
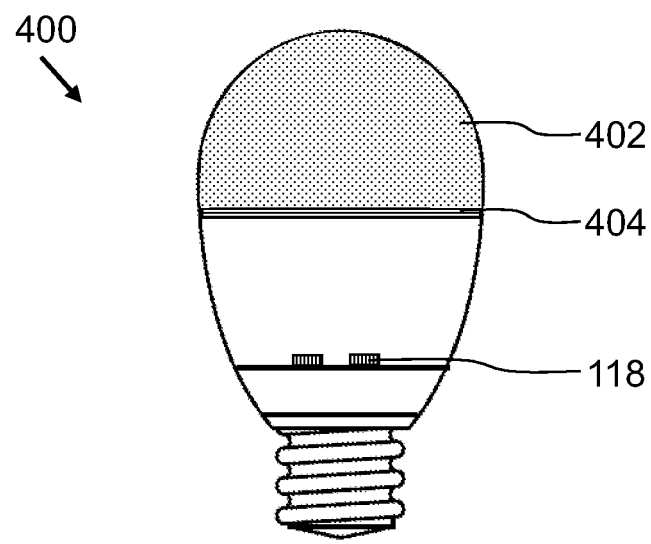
Figure 4B:
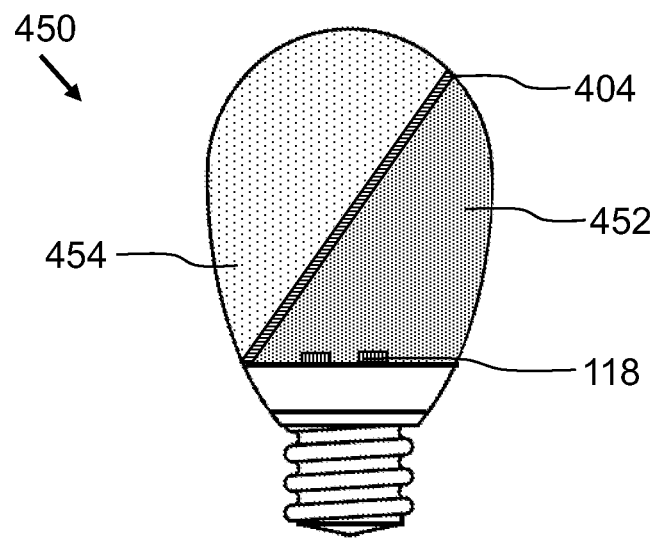

FIGS. 4a and 4b present embodiments of lamps 400, 450. The embodiments are similar to previous discussed embodiments of a lamp, however, the difference mainly consists of the fact that the diffusing plate 404 do not comprise luminescent material, but that luminescent material is applied as a coating to parts of the inner side of the light bulb. The diffusing plates 404 have an edge and the edge touches the light bulb thereby separating the first part of the light exit window from the second part of the light exit window.

In FIG. 4a, the lamp 400 comprises light sources 118 which emit light of the first color towards the diffusing plate 404 and a first part of the light exit window. The diffusing plate 404 is, for example, a scattering layer which scatters light as the result of an uneven surface or as the result of scattering particles which are provided within or on surfaces of the diffusing plate 404. A part of the light which impinges on the light scattering layer is reflected or scattered back towards the light sources 118 and the first part of the light exit window. Thus, a significant amount of light of the first color is emitted through the first part of the light exit window. Light which is transmitted through the light distributing layer is emitted towards the second part of the light exit window. This light is still of the first color. At the inner surface of the light bulb, at the area of the inner surface which forms the second part of the light exit window, a luminescent coating 402 is applied. The luminescent coating 402 comprises luminescent material which converts light of the first color into light of the second color. Thus, the light which is transmitted through the diffusing plate 404 impinges on the luminescent coating and at least a part of the light of the first color is converted to light of the second color. The light of the second color is emitted in all directions and the light which is emitted towards the diffusing plate 404 is only transmitted to a limited extent through the light distributing layer. Thus, a significant amount of light of the second color is emitted through the second part of the light exit window and a limited amount of light of the first color may be emitted through the second part. Further, a significant amount of light of the first color is emitted through the first part of the light exit window and a limited amount of light of the second color is emitted through the first part.

In FIG. 4b, the lamp 450 comprises a diffusing plate 404 which is arranged in a diagonal orientation with respect to the base on which the light sources 118 are provided. The edge of the diffusing plate 404 touches the light bulb, and thus the light exit window, and thereby separates the first part of the light exit window from the second part. The inner surface of the light bulb, which forms the first part of the light exit window, is coated with a first luminescent coating 452 which comprises a first organic phosphor which converts, in use, light of a first color towards light of a second color. The inner surface of the light bulb, which forms the second part of the light exit window, is coated with a second luminescent coating 454 which comprises a second organic phosphor which converts, in use, light of the first color towards light of the third color. Thus, in line with previous discussions, the lamp 450 emits a first color distribution of light through the first part of the light exit window, and emits a second color distribution of light through the second part of the light exit window. If, for example, the first color is light in the UV spectrum, and if the light bulb is made of glass which filters UV light, the first color distribution mainly comprises light of the second color, and the second color distribution mainly comprises light of the third color. If the first color is in the visible spectrum, the first color distribution additionally comprises a significant amount of light of the first color, and the second color distribution additionally comprises a relative small amount of light of the first color.

Figure 5A:
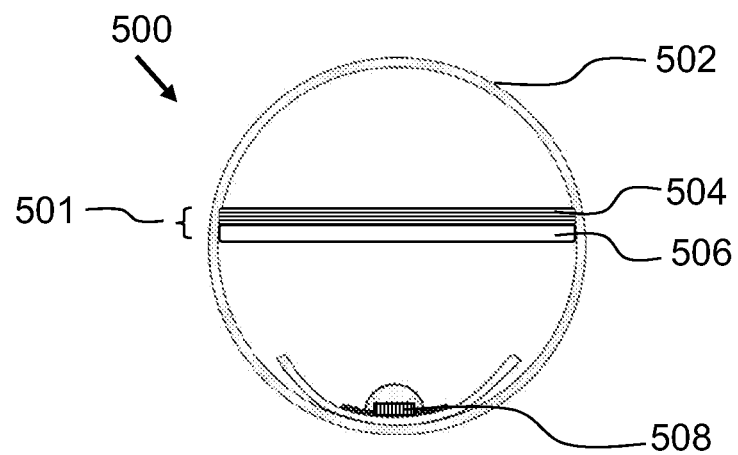

FIG. 5a presents a cross-section of a lamp 500 manufactured of a tube of glass 502. At the base of the tube 502 is provided a light source 508 which emits, in use, light of a predefined color spectrum comprises light of a first color. In the centre of the tube 502 is provided a light distributing layer 501 which is similar to light distributing layer 108 of the lighting device 100. Thus, the light distributing layer 501 is not fully transparent and consists of two layers, namely a carrier layer 506 which transmits light and a luminescent layer 504 which comprises luminescent material. The luminescent material converts, in use, light of the first color towards light of the second color. An edge of the light distributing layer 501 touches the tube 502 and thereby it separates a first part of the light exit window from a second part of the light exit window. The lamp 500 operates in a similar way as the lighting device 100 and, thus, provides the lamp 500 different color distributions in different directions.

Figure 5B:
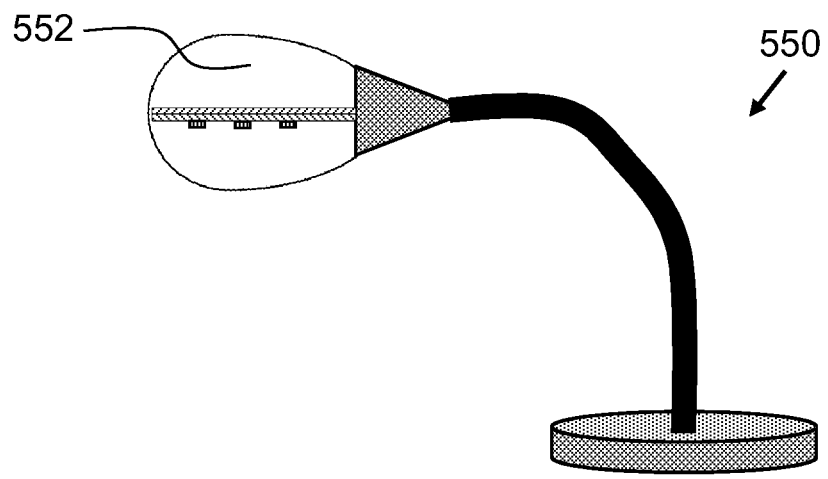

FIG. 5b presents a luminaire 550 which comprises a lighting device according to the first aspect of the invention or comprises a lamp 552 according to the second aspect of the invention.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A lighting device for emitting a first color distribution predominantly in a first direction and for emitting a second color distribution predominantly in a second direction, the lighting device comprising:
   a light exit window for emitting light into the ambient of the lighting device, the light exit window having a first part for an escape of light of the first color distribution and a second part for an escape of light of the second color distribution, the second part being different from the first part,
   a light source for emitting light of a predefined color distribution comprising light of a first color,
   a first light distributing layer for partly reflecting or back-scattering impinging light and partly transmitting impinging light, the first light distributing layer arranged in between the light source and the second part of the light exit window, the first light distributing layer not being fully transparent, the first light distributing layer having an edge near the light exit window for separating the first part and the second part, a luminescent material for converting light of the first color to light of a second color, the luminescent material being arranged in the first light distributing layer, or being arranged in between the first light distributing layer and the second part of the light exit window, or being arranged on the first part of the light exit window or on the second part of the light exit window.

2. A lighting device according to claim 1, wherein the first light distributing layer comprises a diffusing plate.

3. A lighting device according to claim 1, wherein at least one of the predefined color distribution, the first color and the second color comprise light of a color in the visible light spectrum.

4. A lighting device according to claim 1, wherein the luminescent material is an organic phosphor.

5. A lighting device according to claim 4, wherein the organic phosphor comprises perylene derivatives.

6. A lighting device according to claim 1, further comprising another luminescent material for converting a first color into a third color, the another luminescent material being arranged in between the light source and the first part of the light exit window or arranged in between the light source and the first light distributing layer.

7. A lighting device according to claim 1, further comprising a second light distributing layer for partly reflecting or backscattering impinging light and partly transmitting impinging light, the second light distributing layer being arranged in between the first light distributing layer and the second part of the light exit window, the second light distributing layer not being fully transparent, wherein
the light exit window has a third part overlapping with a section of the second part of the light exit window,
the second light distributing layer has an edge near the light exit window for forming a border of the third part.

8. A lighting device according to claim 7, further comprising a further luminescent material for converting light of a first color light of a fourth color, the luminescent material being arranged in the second light distributing layer, or in between the second light distributing layer and the third part of the light exit window.

9. A lighting device according to claim 1, wherein, the light source is provided on the first light distributing layer and the light source emits light in a direction away from the first light distributing layer.

10. A lighting device according to claim 1, wherein, the first light distributing layer has a shape which is a non-flat for influencing the directions in which light is reflected, scattered, transmitted and/or emitted.

11. A lighting device according to claim 1, the light distributing layer comprising at least one of:
a color filter for filtering the color distribution of light which is transmitted through the color filter,
a switchable scattering element for scattering light in response to a control signal,
a dichromatic filter for filtering a color of light which is transmitted through the dichromatic filter and reflecting light of another color.

12. A lamp comprising the lighting device according to claim 1.

13. A lamp according to claim 12 comprising a retrofit light bulb or a light transmitting tube, wherein the light exit window is formed by the retrofit light bulb and the light source is arranged on a base of the retrofit light bulb, or wherein the light exit window is formed by a part of a light transmitting tube and the light source is arranged on a section of the light transmitting tube being different from the light exit window.

14. A lighting device according to claim 7, wherein the light source is provided on the first light distributing layer or on the second light distributing layer and the light source emits light in a direction away from the first light distributing layer or away from the second light distributing layer (312), respectively.

15. A lighting device according to claim 7, wherein at least one of the first light distributing layer and the second light distributing layer has a shape which is a non-flat for influencing the directions in which light is reflected, scattered, transmitted and/or emitted.

* * * * *